(12) United States Patent
Cho et al.

(10) Patent No.: US 8,344,381 B2
(45) Date of Patent: Jan. 1, 2013

(54) FLAT DISPLAY PANEL, UV SENSOR AND FABRICATION METHOD THEREOF

(75) Inventors: An-Thung Cho, Hsin-Chu (TW); Chi-Hua Sheng, Hsin-Chu (TW); Ruei-Liang Luo, Hsin-Chu (TW); Wan-Yi Liu, Hsin-Chu (TW); Wei-Min Sun, Hsin-Chu (TW); Chi-Mao Hung, Hsin-Chu (TW); Chun-Hsiun Chen, Hsin-Chu (TW); Wei-Ming Huang, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 298 days.

(21) Appl. No.: 12/709,506

(22) Filed: Feb. 21, 2010

(65) Prior Publication Data

US 2010/0327289 A1    Dec. 30, 2010

(30) Foreign Application Priority Data

Jun. 29, 2009 (TW) ............................. 98121817 A

(51) Int. Cl.
 *H01L 21/00* (2006.01)
(52) U.S. Cl. .................. 257/59; 257/72; 257/E21.409; 257/E29.003; 257/E29.169; 257/E31.007
(58) Field of Classification Search .................. 257/59, 257/72, 85, E21, 409, 417, 29.003, 169, 293, 257/328, 31.007, 33.008
See application file for complete search history.

(56) References Cited

U.S. PATENT DOCUMENTS

| | | | |
|---|---|---|---|
| 6,008,872 A * | 12/1999 | den Boer et al. | 349/106 |
| 7,271,393 B2 | 9/2007 | Makela | |
| 7,615,479 B1 * | 11/2009 | Craig et al. | 438/618 |
| 7,790,487 B2 * | 9/2010 | Shih et al. | 438/30 |
| 7,965,363 B2 * | 6/2011 | Takeda et al. | 349/139 |
| 2004/0155199 A1 | 8/2004 | Su | |
| 2006/0033876 A1 * | 2/2006 | Park et al. | 349/155 |
| 2006/0119932 A1 * | 6/2006 | Park et al. | 359/350 |
| 2006/0138946 A1 * | 6/2006 | Wang et al. | 313/506 |
| 2006/0145161 A1 * | 7/2006 | Lee et al. | 257/72 |
| 2007/0222923 A1 * | 9/2007 | Wang et al. | 349/110 |
| 2008/0001139 A1 * | 1/2008 | Augusto | 257/13 |
| 2008/0179762 A1 * | 7/2008 | Cho et al. | 257/E31.001 |
| 2009/0009675 A1 * | 1/2009 | Cho et al. | 349/43 |
| 2010/0039354 A1 * | 2/2010 | Sakamoto | 345/55 |
| 2010/0328586 A1 * | 12/2010 | Huang et al. | 349/106 |
| 2011/0176098 A1 | 7/2011 | Takeda et al. | |

FOREIGN PATENT DOCUMENTS

| | | |
|---|---|---|
| CN | 101231944 A | 7/2008 |
| CN | 100419534 C | 9/2008 |
| TW | 1272557 | 2/2007 |
| TW | 200832516 | 8/2008 |

* cited by examiner

*Primary Examiner* — Michael Lebentritt
(74) *Attorney, Agent, or Firm* — Winston Hsu; Scott Margo

(57) ABSTRACT

A UV sensor comprises a silicon-rich dielectric layer with a refractive index in a range of about 1.7 to about 2.5 for serving as the light sensing material of the UV sensor. The fabrication method of the UV sensor can be integrated with the fabrication process of semiconductor devices or flat display panels.

16 Claims, 10 Drawing Sheets

FLAT DISPLAY PANEL, UV SENSOR AND FABRICATION METHOD THEREOF

BACKGROUND OF THE INVENTION

1. Field of the Invention

The present invention relates to an ultraviolet (UV) sensor and a fabrication method thereof, and more particularly to a UV sensor including at least a silicon-rich (Si-rich) dielectric material and a fabrication method thereof.

2. Description of the Prior Art

The UV sensors (UVS) have been widely applied in fire hazard monitoring, contamination analyses, astronomical observations, medical facilities, and even military applications. Nowadays, UV sensors are further applied with light emitting diodes with material of Indium Gallium Nitride (InGaN) for example or laser device to form an ultraviolet-blue ray data access system.

In another aspect, the ozone layer in the atmosphere has long been damaged by chloroflurocarbons (CFCs) emitted by human related activities or other factors, causing the UV radiation near the surface of the earth to increase every year. Meanwhile, long term exposure under the UV light rays may cause pathological changes to human skins. Therefore, if a UV sensor could monitor UV levels, warnings of dangerous UV levels could be made in advance. For instance, the warnings provided by the UV sensor could warn the people immediately so that they can avoid going outside to be exposed to strong UV light rays or prepare with protection against the UV light rays.

In general, UV light rays are categorized into UV-A, UV-B, and UV-C. The UV-A, UV-B, and UV-C have wavelengths of 315 to 400 nanometers, 280 to 315 nanometers and 100 to 280 nanometers respectively. Of all three categories, UV-C with the shortest wavelengths has the most harmful radiation against the human beings. Fortunately, it is difficult for UV-C radiation to reach the Earth's surface. As a result, the primary sensing targets of UV sensors usually focus on UV-A and the UV-B.

Conventional UV sensors often use group III-V metals such as gallium nitride (GaN) or aluminum gallium nitride (AlGaN) as light sensing materials; however, these materials are often expensive such that the fabrication cost of the UV sensors cannot be effectively reduced. Also, the UV sensors with GaN or AlGaN materials as light sensing materials possess the issues of heavy contaminations as well as having difficulties to be integrated with semiconductor fabrication process. Moreover, the UV sensors with GaN or AlGaN materials also possess issues such as over heating of parts during sensing operation, which reduces the sensing performance, making these sensors impractical. In addition, amorphous silicon thin films or polycrystalline silicon thin films has been conventionally used as the light sensing materials of visible light sensor when integrating photosensor with a display panel; however, the amorphous silicon or the polycrystalline silicon materials are more sensitive to visible light and infrared light rays than UV light rays, and the amorphous silicon and polycrystalline silicon have poor photoelectric conversions as well as poor reliability. Therefore the amorphous silicon and the polycrystalline silicon materials cannot be applied in UV sensor products effectively. To summarize, the industry must continue in research to seek for the appropriate light sensing materials and structures for the UV sensors, and to provide a UV sensing structure and a fabrication method suitable for integrating the UV sensors to the semiconductor processes or display panels.

SUMMARY OF THE INVENTION

It is one of the primary objectives of the present invention to provide a UV sensor and a flat display panel including a silicon-rich dielectric layer with a refractive index ranging from about 1.7 to about 2.5, so as to solve the above-mentioned problem that conventional UV sensors have low sensitivities or have difficulties in integrating with the fabrication process of semiconductors.

According to the claimed invention, the present invention provides a flat display panel including a lower substrate, an upper substrate disposed in parallel with and above the lower substrate, and a display material layer disposed between the upper substrate and the lower substrate. The lower substrate includes a display region and a peripheral region. The flat display panel of the present invention further includes at least a pixel structure disposed in the display region and at least a UV sensing structure disposed in the peripheral region. The UV sensing structure includes a bottom UV sensing electrode disposed on the surface of the lower substrate, a patterned first silicon-rich dielectric layer disposed on the surface of the bottom UV sensing electrode, and a top UV sensing electrode disposed on the surface of the patterned first silicon-rich dielectric layer. The patterned first silicon-rich dielectric layer is used for absorbing UV light and has a refractive index in a range of about 1.7 to about 2.5.

According to the claimed invention, the present invention further provides a UV sensor. The UV sensor includes a substrate and at least a UV sensing structure disposed on the substrate. The UV sensing structure includes a bottom UV sensing electrode disposed on the surface of the substrate, a patterned first silicon-rich dielectric layer disposed on the surface of the bottom UV sensing electrode, and a top UV sensing electrode disposed on the surface of the patterned first silicon-rich dielectric layer. The patterned first silicon-rich dielectric layer is used for absorbing UV lights and has a refractive index in a range of about 1.7 to about 2.5.

According to the claimed invention, the present invention further provides a fabrication method of a flat display panel. First, a lower substrate including a display region and a peripheral region is provided. Next, a patterned first conductive layer is formed on the surface of the lower substrate. The patterned first conductive layer includes a bottom UV sensing electrode disposed in the peripheral region. Then a patterned first silicon-rich dielectric layer is formed on the surface of the lower substrate disposed on the surface of the bottom UV sensing electrode. The patterned first silicon-rich dielectric layer has a refractive index in a range of about 1.7 to about 2.5. It is followed that a patterned second conductive layer is formed on the surface of the lower substrate and the patterned second conductive layer includes a top UV sensing electrode disposed on the surface of the patterned first silicon-rich dielectric layer. The bottom UV sensing electrode, the patterned first silicon-rich dielectric layer, and the top UV sensing electrode compose a UV sensing structure. In addition, the fabrication method of the present invention further includes providing an upper substrate disposed in parallel with and above the lower substrate and providing a display material layer disposed between the upper substrate and the lower substrate.

According to the claimed invention, the present invention even further provides a fabrication method for a UV sensor. First, a substrate is provided. Then a patterned first conductive layer is formed on the surface of the substrate. The patterned first conductive layer includes a bottom UV sensing electrode. Next, a patterned first silicon-rich dielectric layer is formed on the surface of the substrate. The patterned first silicon-rich dielectric layer is disposed on the surface of the bottom UV sensing electrode, and the patterned first silicon-rich dielectric layer has a refractive index in a range of about 1.7 to about 2.5. Then a patterned second conductive layer is formed on the surface of the substrate. The patterned second conductive layer includes a top UV sensing electrode disposed on the surface of the patterned first silicon-rich dielectric layer. The bottom UV sensing electrode, the patterned first silicon-rich dielectric layer, and the top UV sensing electrode compose a UV sensing structure of the present invention.

The UV sensor of the present invention utilizes the silicon-rich dielectric material as the light sensing material to achieve advantages such as high stability, low fabrication cost, and high integrating probability which makes the UV sensor of the present invention suitable in applications with thin film transistors or semiconductor devices, such as flat display panel, so as to raise the added values of the products effectively.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
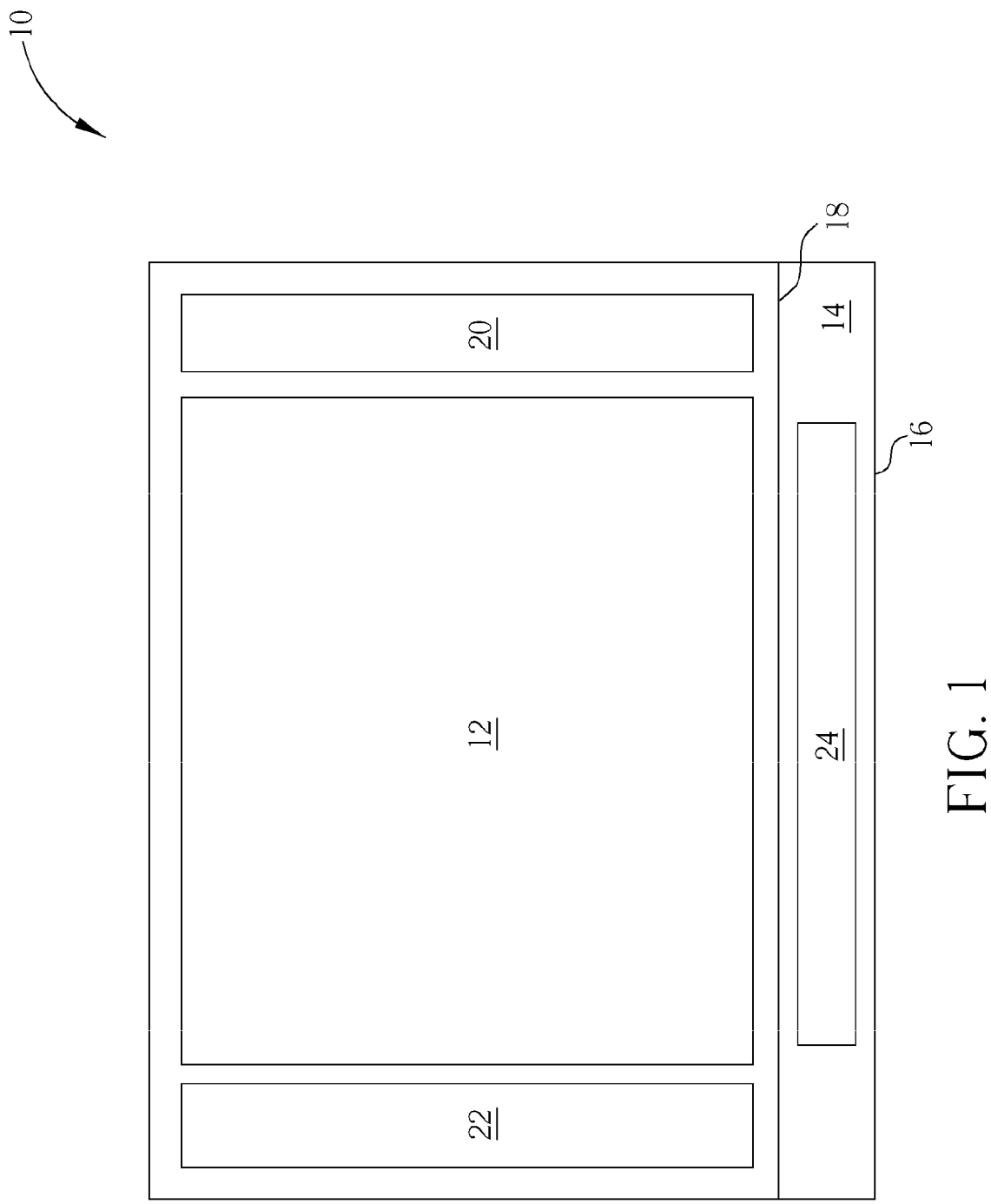
FIG. 1 is schematic diagram of the top view of a flat display panel of the present invention.

With reference to FIG. 1, FIG. 1 is a schematic diagram of the top view of a flat display panel 10 of the present invention. The flat display panel 10 includes a display region 12 and a peripheral region 14. The peripheral region 14 is disposed at the periphery of the flat display panel 10. In general, the flat display panel 10 includes a lower substrate 16 and an upper substrate 18, and the display region 12 is located in the partial overlapping portion of the upper substrate 18 and the lower substrate 16. The flat display panel 10 includes an ultraviolet (UV) sensor 20 and further a visible light sensor (VLS) 22 disposed in the peripheral region 14, and a circuit board 24 such as a flexible printed circuit (FPC) may be optionally disposed on the surface of the peripheral region 14 for connecting external signals or circuits to the flat display panel 10.

Figure 2:
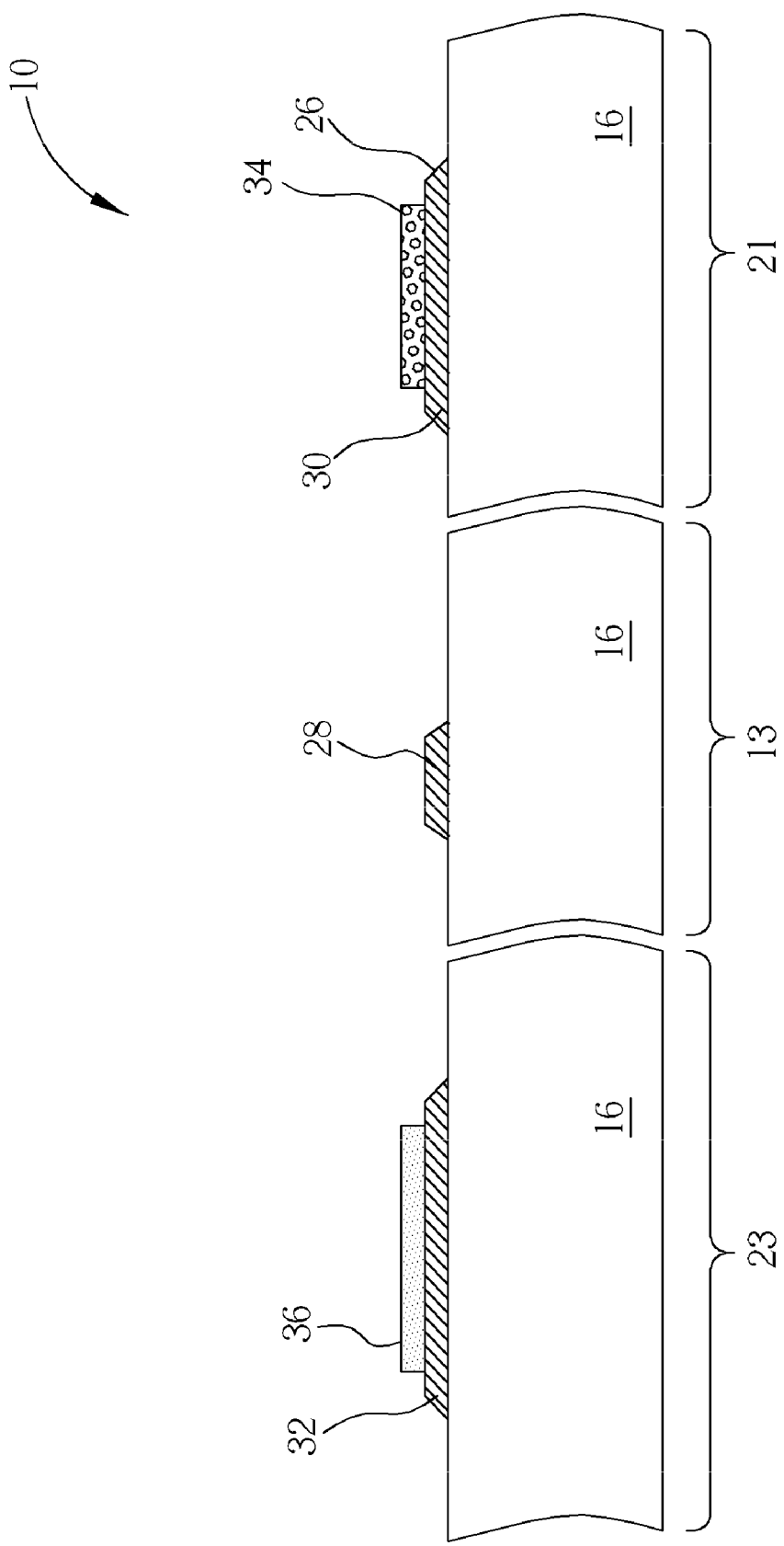
FIG. 2 to FIG. 4 are partial cross-sectional diagrams illustrating the fabrication method of a first embodiment of the flat display panel of the present invention.
Figure 3:
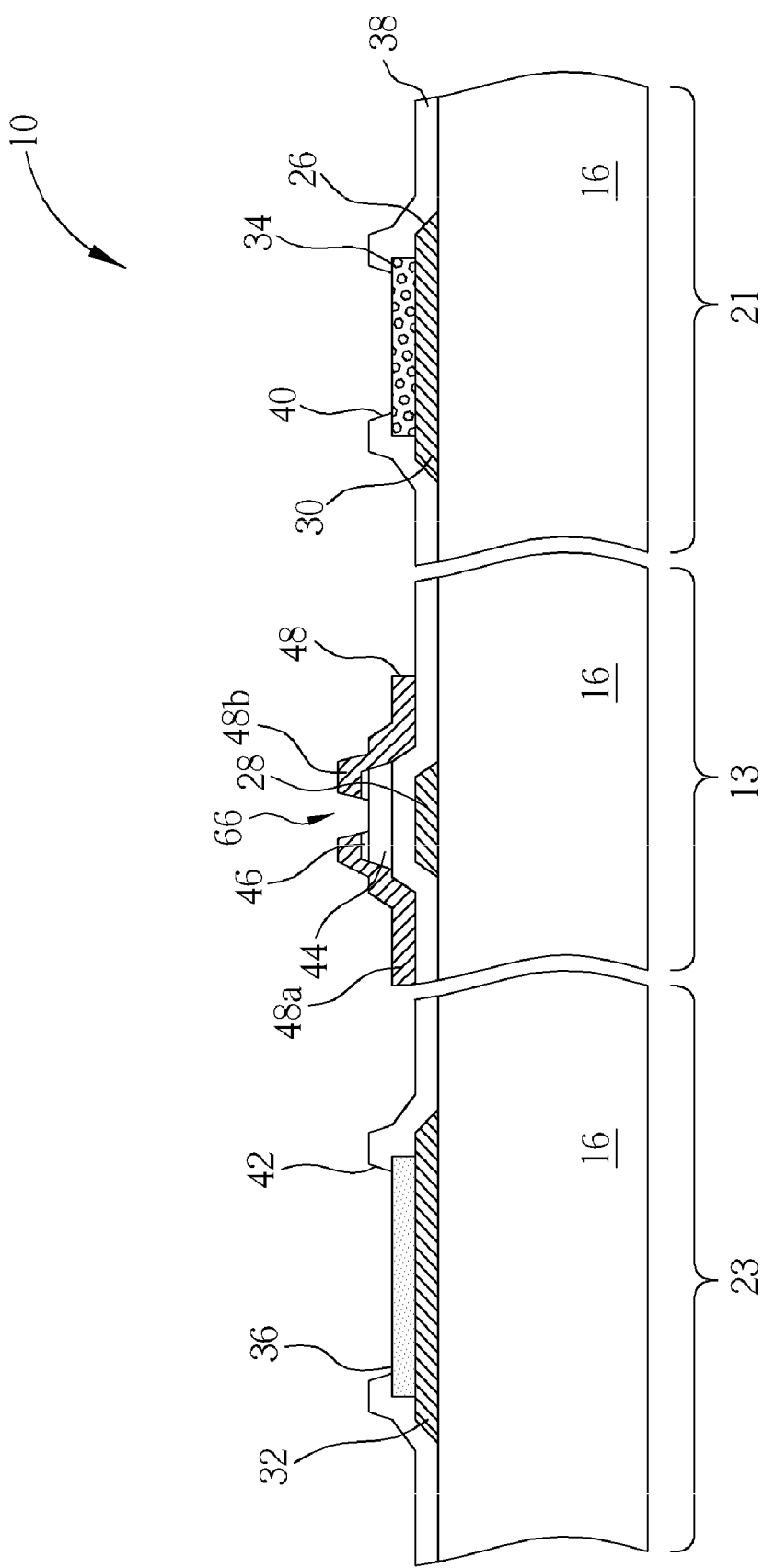
Figure 4:
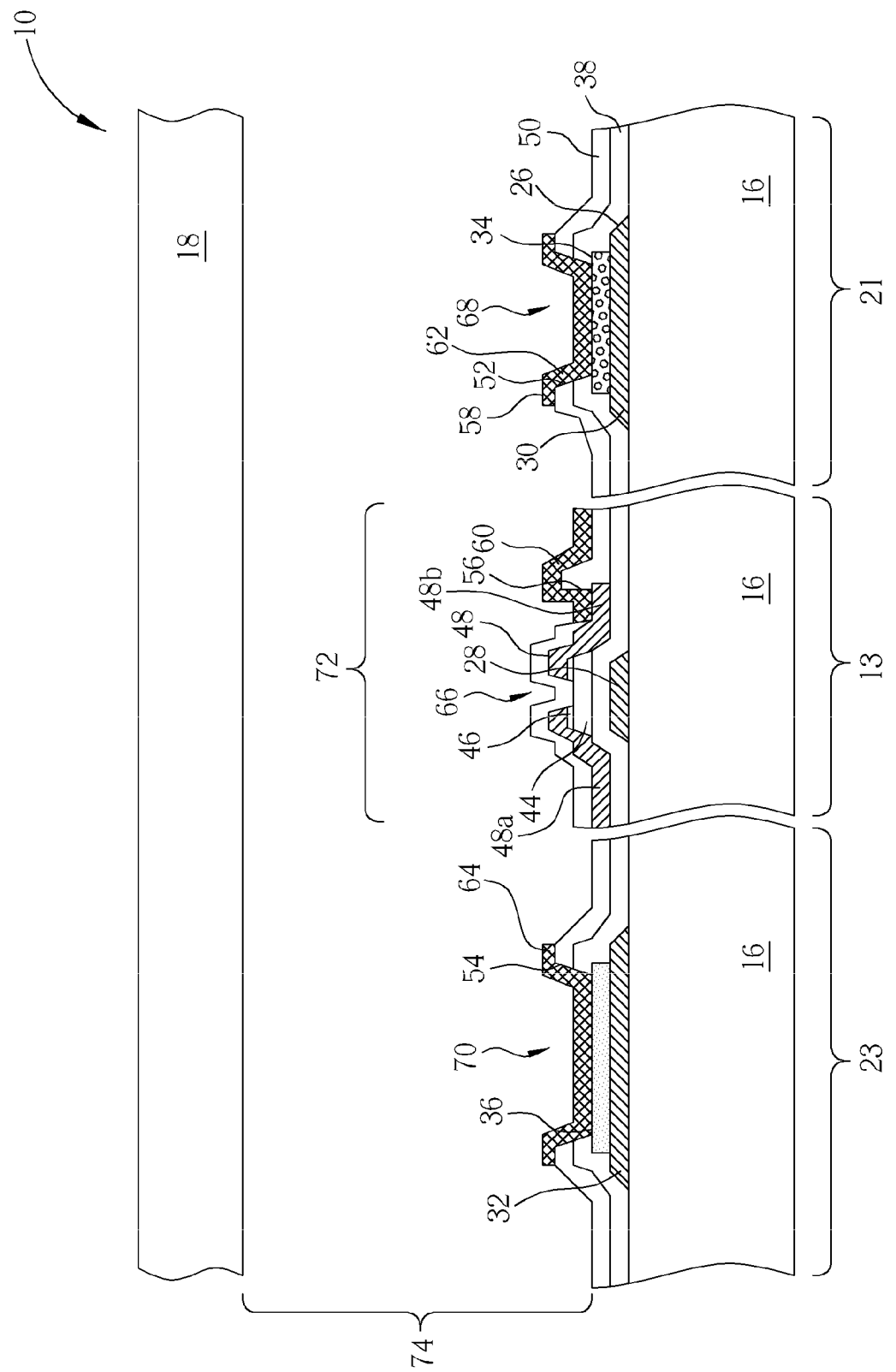

FIG. 2 to FIG. 4 are partial cross-sectional diagrams illustrating the fabrication method of a first embodiment of the flat display panel of the present invention. Referring to FIG. 2, during the fabrication method of the flat display panel 10 of the present invention, a lower substrate 16 is first provided. Then a patterned first conductive layer 26 is formed on the surface of the lower substrate 16. The patterned first conductive layer 26 includes a gate electrode 28, a bottom UV sensing electrode 30, and a bottom visible light sensing electrode 32. The fabrication method of the patterned first conductive layer 26 may include first depositing a first conductive layer (not illustrated) on the surface of the lower substrate 16 and performing a patterning process to the first conductive layer such as a photolithography-etching-process for removing parts of the first conductive layer. After the patterning process, the remaining patterned conductive layer 26 includes the gate electrode 28, the bottom UV sensing electrode 30 and the bottom visible light sensing electrode 32 disposed in a transistor reserved region 13, a UV sensing structure reserved region 21 of the UV sensor 20 and a visible light sensing structure reserved region 23 of the visible light sensor 22 on the lower substrate 16 respectively. In addition, the patterned first conductive layer 26 preferably includes metallic materials.

Then a patterned first silicon-rich dielectric layer 34 is formed on the surface of the lower substrate 16. Wherein, at least a portion of the patterned first silicon-rich dielectric layer 34 is located on the surface of the bottom UV sensing electrode 30. In a preferred embodiment, materials of the patterned first silicon-rich dielectric layer 34 may include Si-rich silicon oxide ($SiO_x$), Si-rich silicon nitride ($SiN_y$), Si-rich silicon oxynitride ($SiO_xN_y$), Si-rich silicon oxycarbide ($SiO_xC_z$), hydrogenated Si-rich silicon nitride ($SiN_y$:H), hydrogenated Si-rich silicon oxide ($SiO_x$:H), hydrogenated silicon-rich silicon oxynitride ($SiO_xN_y$:H), hydrogenated silicon-rich silicon oxycarbide ($SiO_xC_z$:H) or combinations of above materials, wherein $0<x<2$, $0<y<1.33$, $0<z<1$. In addition, the patterned first silicon-rich dielectric layer 34 has a refractive index in a range of about 1.7 to about 2.5. A preferred thickness of the patterned first silicon-rich dielectric layer 34 is about 50 nanometers to about 500 nanometers. Furthermore, the fabrication method of forming the patterned first silicon-rich dielectric layer 34 preferably includes performing a first chemical vapor deposition (CVD) process which deposits a first silicon-rich dielectric layer (not illustrated) on the surface of the lower substrate 16, performing a photolithography-etching-process by a photo mask to form the patterned first silicon-rich dielectric layer 34. The first CVD process includes introducing silane ($SiH_4$), ammonia ($NH_3$), and hydrogen ($H_2$) gases to a CVD reaction chamber. A preferred $SiH_4$ to $NH_3$ gas flow ratio is about 0.5 to about 10, and a preferred $H_2$ to $SiH_4$ gas flow ratio is about 0 to about 8. A part of the patterned first silicon-rich dielectric layer 34 disposed on the surface of the bottom UV sensing electrode 30 serves as a UV sensing device and preferably, the area of the bottom UV sensing electrode 30 is larger than the area of the UV sensing device so that the bottom UV sensing electrode 30 can block lights emitted from the bottom side of the lower substrate 16.

Then, a second CVD process and a photolithography-etching-process are performed to form a patterned second silicon-rich dielectric layer 36 on the surface of the lower substrate 16. The patterned second silicon-rich dielectric layer 36 includes at least a part disposed on the surface of the bottom visible light sensing electrode 32 for serving as a visible light sensing device. The patterned second silicon-rich dielectric layer 36 has a refractive index in a range of about 2.5 to about 3.3. In addition, during the second CVD process, a preferred $SiH_4$ to nitrous oxide ($N_2O$) gas flow ratio is about 1.2 to about 10.0, and a preferred $H_2$ to $SiH_4$ gas flow ratio is about 0 to about 8. Furthermore, the patterned second silicon-rich dielectric layer 36 may be made of Si-rich silicon oxide (SiOx), Si-rich silicon nitride (SiNy), Si-rich silicon oxynitride (SiOxNy), Si-rich silicon oxycarbide (SiOxCz), hydrogenated Si-rich silicon nitride (SiNy:H), hydrogenated Si-rich silicon oxide (SiOx:H), hydrogenated silicon-rich silicon oxynitride (SiOxNy:H), hydrogenated silicon-rich silicon oxycarbide (SiOxCz:H) or combinations of above materials, wherein $0<x<2$, $0<y<1.33$, $0<z<$. It should be noted that in other embodiments, the second silicon-rich dielectric layer 36 may first be fabricated, followed by fabricating the patterned first silicon-rich dielectric layer 34.

Then referring to FIG. 3, a patterned gate dielectric layer 38 is formed on the surface of the lower substrate 16. The patterned gate dielectric layer 38 covers a part of the patterned first silicon-rich dielectric layer 34, a part of the bottom UV sensing electrode 30, a part of the patterned second silicon-rich dielectric layer 36, and a part of the bottom visible light sensing electrode 32. In addition, the gate dielectric layer 38 includes a first via hole 40 and a second via hole 42 which expose the most portion of the patterned first silicon-rich dielectric layer 34 and the most portion of the patterned second silicon-rich dielectric layer 36 respectively, and the gate dielectric layer 38 also covers the gate electrode 28. Then a patterned semiconductor layer 44, a patterned ohmic contact layer 46, and a patterned second conductive layer 48 are successively formed on the gate electrode 28 to form a thin film transistor 66. The patterned second conductive layer 48 preferably includes metallic materials and may include a source electrode 48a and a drain electrode 48b, disposed at two sides of the patterned ohmic contact layer 46 and the patterned semiconductor layer 44 respectively and above the patterned ohmic contact layer 46 and the patterned semiconductor layer 44. The patterned semiconductor layer 44 is disposed on the surface of a part of the gate dielectric layer 38 above the gate electrode 28. In the present embodiment, the thin film transistor 66 is an amorphous silicon thin film transistor.

Next, referring to FIG. 4, a patterned passivation layer 50 is formed on the surface of the lower substrate 16, and the patterned passivation layer 50 covers the source electrode 48a, a part of the drain electrode 48b, a part of the patterned first silicon-rich dielectric layer 34, and a part of the patterned second silicon-rich dielectric layer 36. The patterned passivation layer 50 includes a third via hole 52, a fourth via hole 54, and an optional fifth via hole 56 exposing a most portion of the patterned first silicon-rich dielectric layer 34, the most portion of the patterned second silicon-rich dielectric layer 36, and a part of the drain electrode 48b respectively. Then a patterned third conductive layer 58 is formed on the surface of the lower substrate 16. The patterned third conductive layer 58 includes a top UV sensing electrode 62 and a top visible light sensing electrode 64. The top UV sensing electrode 62 fills the third via hole 52, and covers a part of the gate dielectric layer 38 and a part of the passivation layer 50. The top UV sensing electrode 62 also directly contacts the surface of the patterned first Si-rich dielectric layer 34. The top visible light sensing electrode 64 fills the fourth via hole 54 and directly contacts the patterned second silicon-rich dielectric layer 36. Thus, the fabrication of the UV sensing structure 68 and the visible light sensing structure 70 is completed. The UV sensing structure 68 from bottom to top includes the bottom UV sensing electrode 30, the patterned first silicon-rich dielectric layer 34, and the top UV sensing electrode 62 in sequence, and the patterned first silicon-rich dielectric layer 34 acts as the UV sensing device of the UV sensing structure 68. On the other hand, the visible light sensing structure 70 from bottom to top includes the bottom visible light sensing electrode 32, the patterned second silicon-rich dielectric layer 36, and the top visible light sensing electrode 64 in sequence, and the patterned second silicon-rich dielectric layer 36 acts as the visible light sensing device of the visible light sensing structure 70.

In addition, the patterned third conductive layer 58 may optionally include at least a conducting wire or a pixel electrode, such as the pixel electrode 60 shown in FIG. 4. The pixel electrode 60 fills the fifth via hole 56 and is electrically connected to the drain electrode 48b. Under such design, the patterned third conductive layer 58 preferably includes a transparent conductive material, i.e. indium tin oxide. Therefore, the thin film transistor 66 and the pixel electrode 60 compose a pixel structure 72 of the display region 12, and the thin film transistor 66 may serve as the pixel transistor of the pixel structure 72. However, in other embodiments, the thin film transistor 66 may be electrically connected to the bottom UV sensing electrode 30, or the thin film transistor 66 may serve as a switch transistor of the peripheral region 14 (at the time the drain electrode 48b is electrically connected to a conducting wire). After the fabrication of the electrical components and the pixel structure 72 on the surface of the lower substrate 16 is completed, an upper substrate 18 is further provided in parallel with the lower substrate 16, wherein the bottom surface of the upper substrate 18 faces the top surface of the lower substrate 16. Also, a display material layer 74, such as a liquid crystal material layer, is provided to be disposed between the upper substrate 18 and the lower substrate 16 to complete the fabrication of the flat display panel 10. In other embodiments, the present invention is not limited to the liquid crystal display panel and can be an electrophoretic display panel, an organic electroluminescent light emitting diode display panel or other flat display panels with integrated thin film transistor. It is well known by a person skilled in the art and not described in detail herein.

Figure 5:
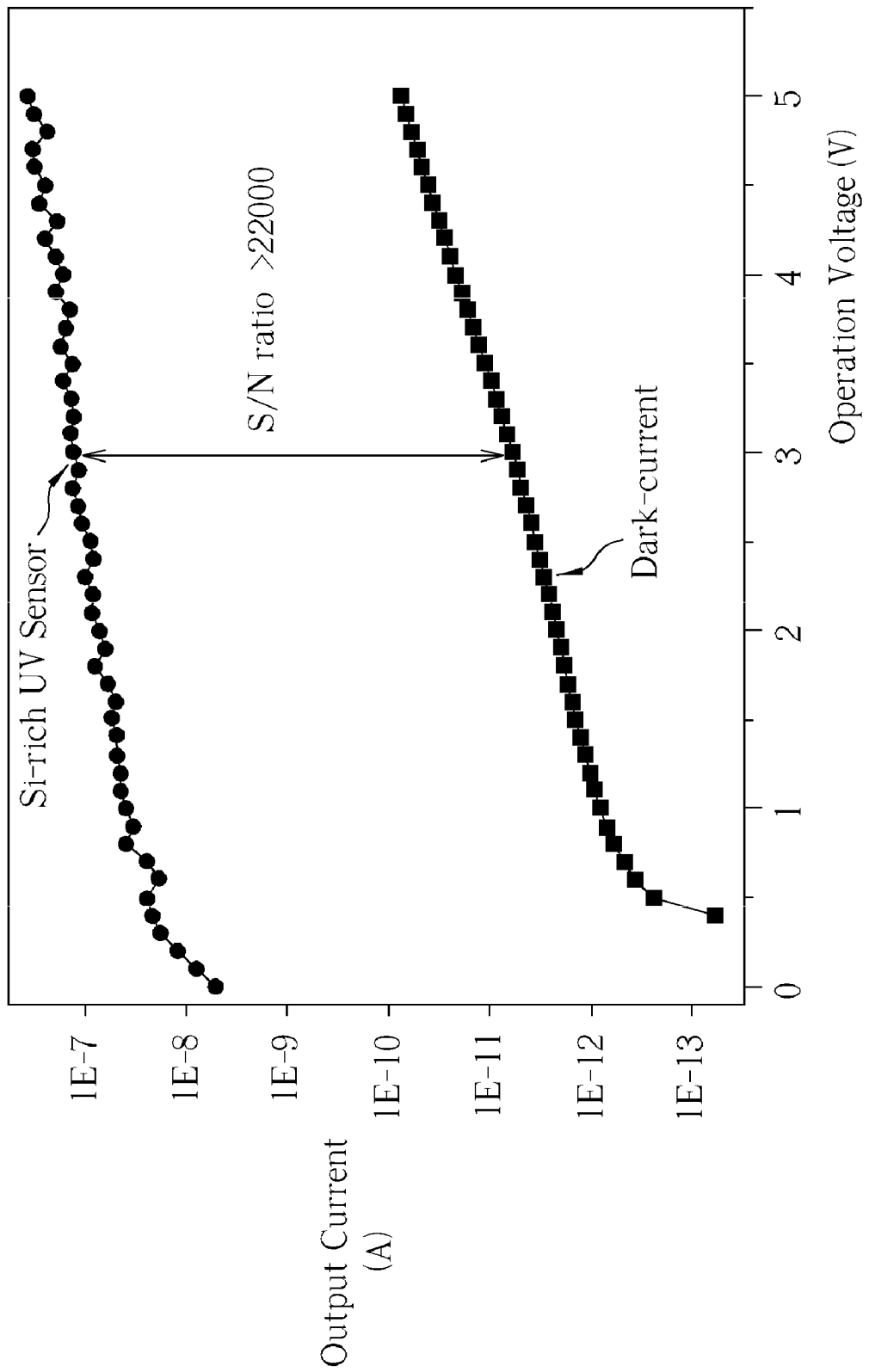
FIG. 5 is a schematic diagram of output signal curve of the UV sensor of the present invention.

Referring to FIG. 5, FIG. 5 is a schematic diagram of an output signal curve of the previously described UV sensor 20 of the present invention fabricated by the patterned first silicon-rich dielectric layer 34 materials. When a UV light emitting diode (wavelength of approximately 310 nm) illuminates to the UV sensor 20 of the present invention, the relationship between an output current to an operating voltage is illustrated by the circular signs on the figure. When no light source is provided, the dark current of the UV sensor 20 of the present invention is illustrated by the rectangular signs on the figure. The unit of the output current is ampere (denoted as "A" in the figure) and the unit of the operating voltage is volt (denoted as "V" in the figure). In accordance with FIG. 5, a signal/noise (S/N) ratio of the UV sensor 20 of the present invention is greater than 2200. As a result, the UV sensor 20 of the present invention has a good UV sensing efficiency.

Figure 6:
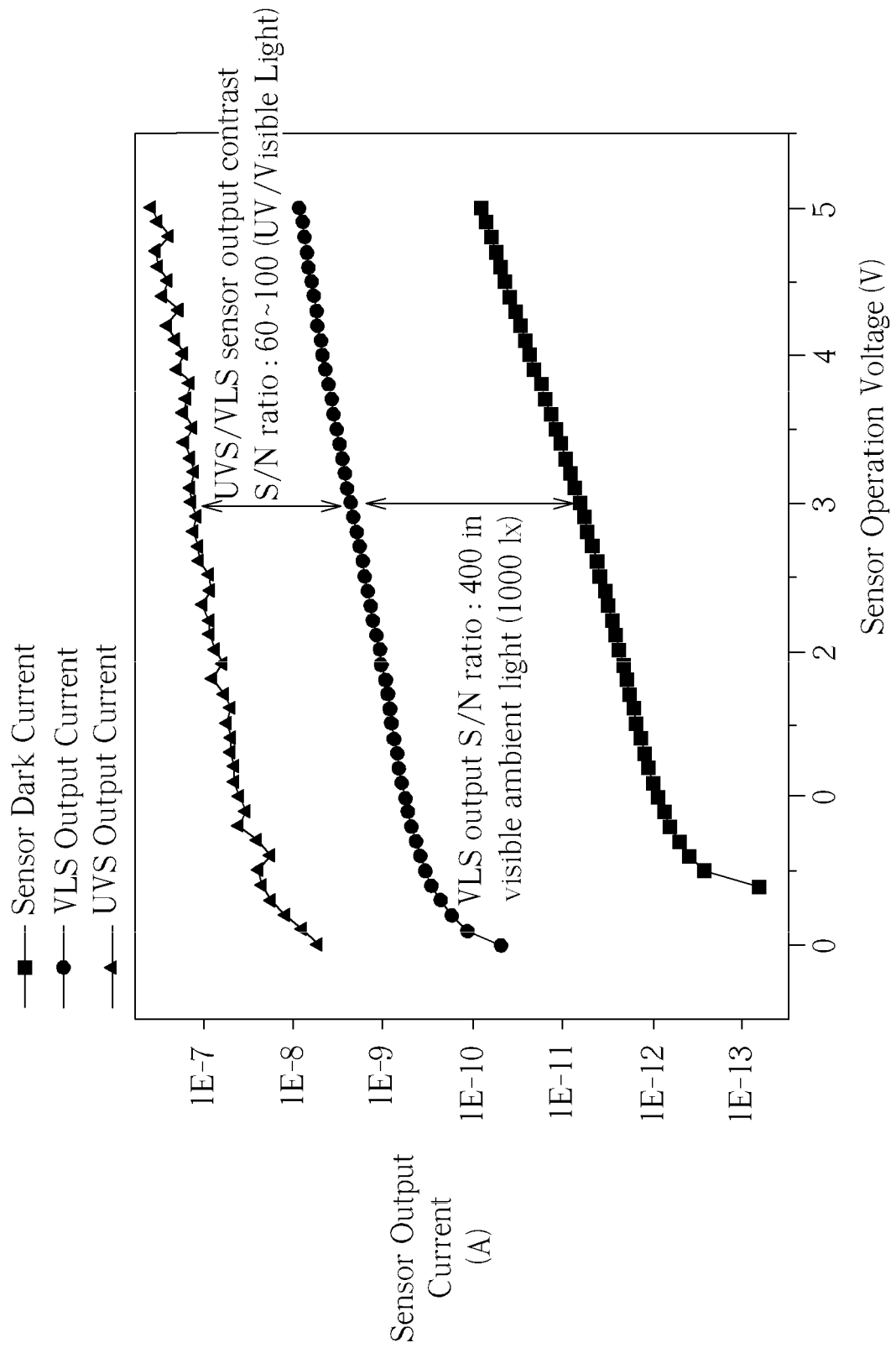
FIG. 6 is a schematic diagram of light sensing signal curves of the UV sensor and the visible light sensor of the flat display panel of the present invention.

Referring to FIG. 6, FIG. 6 illustrates a schematic diagram of light sensing signal curves of the flat display panel 10 with the UV sensor 20 and the visible light sensor 22 of the present invention. According to the figure, the visible light sensor 22 of the present invention has an S/N ratio over 400 while the contrast S/N ratio of the UV sensor 20 to the visible light sensor 22 is greater than about 60 to about 100. Therefore, both the UV sensor 20 and the visible light sensor 22 exhibit good photo sensitivities, and the efficiency of the UV sensor 20 is better than that of the visible light sensor 22.

Figure 7:
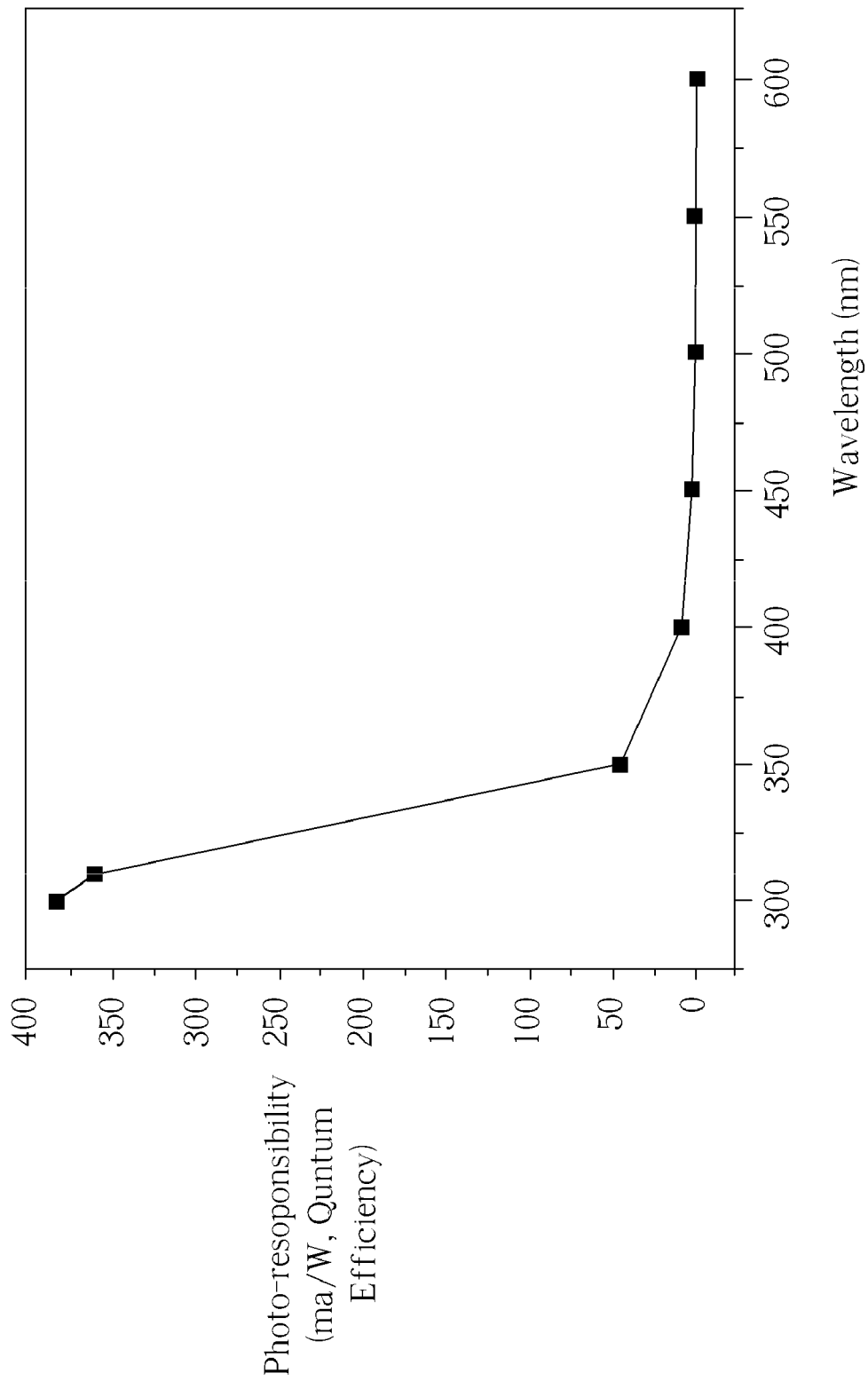
FIG. 7 is a photo-responsivity spectrum of the patterned first silicon-rich dielectric layer versus lights with various wavelengths of the UV sensing structure of the present invention.

Referring to FIG. 7, FIG. 7 illustrates a photo-responsivity spectrum of the patterned first silicon-rich dielectric layer 34 versus lights with various wavelengths of the previously described UV sensing structure 68 of the present invention. According to the figure, the UV sensing structure 68 of the present invention has a strong photo-responsivity to the UV light of wavelengths between about 300 nanometers to about 400 nanometers, and the contrast photo-responsivity ratio of the UV light with wavelengths between about 200 nanometers to about 400 nanometers the visible light is greater than 50. Therefore, in accordance with FIG. 5 to FIG. 7, the UV sensing structure 68 of the present invention has a good UV sensing performance. In addition, when the flat display panel 10 includes both the UV sensor 20 and the visible light sensor 22 of the present invention, it has good S/N ratios both to UV light and visible light.

Figure 8:
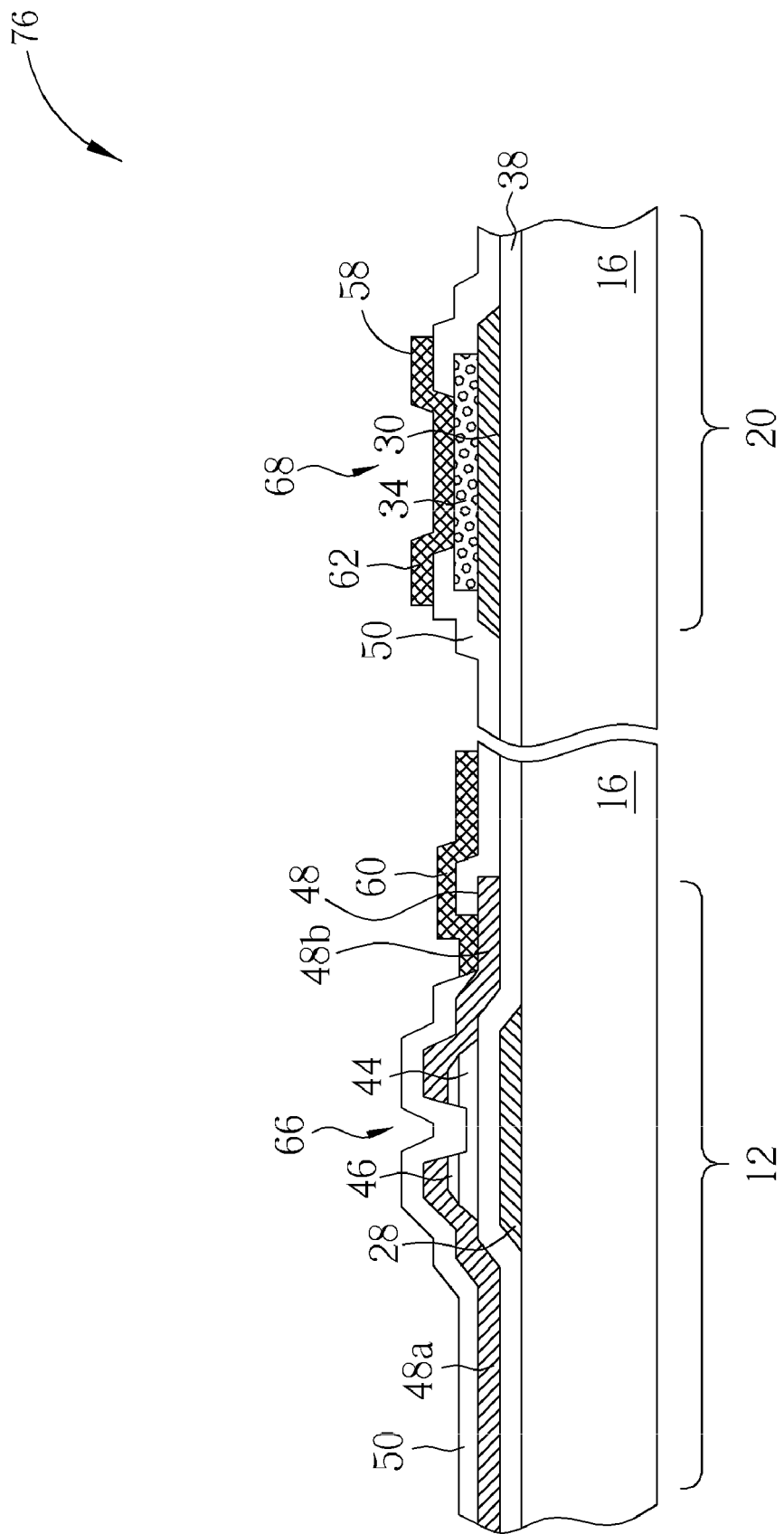
FIG. 8 is a schematic cross-sectional diagram of the UV sensor of a second embodiment of the present invention.

Referring to FIG. 8, FIG. 8 is a schematic cross-sectional diagram of the UV sensor 20 of another embodiment of the present invention. Similar or the same elements are designated by the same numerals of FIG. 1 to FIG. 4. According to the present embodiment, the UV sensor 20 of the present invention is an in-cell type sensor. The UV sensor 20 includes at least a UV sensing structure 68 disposed in a flat display panel 76. The flat display panel 76 may further include a thin film transistor 66 and a pixel electrode 60 disposed in the display region (not illustrated). Also, the flat display panel 76 may include other thin film transistors disposed in the peripheral region of the flat display panel 76 or electrically connected to the UV sensing structure 68. The difference between the present embodiment with the previous embodiment is that the bottom UV sensing electrode 30 is composed of the patterned second conductive layer 48 and is located above the gate dielectric layer 38. Therefore, the bottom UV sensing electrode 30 is fabricated under the same process step as the source electrode 48*a* and the drain electrode 48*b*. Then the patterned first silicon-rich dielectric layer 34 is formed to act as the UV sensing device of the UV sensing structure 68. Subsequently, a patterned passivation layer 50 is formed, exposing a part of the drain electrode 48*b* and the great portion of the patterned first silicon-rich dielectric layer 34. Next, a patterned third conductive layer 58 is formed on the surface of the lower substrate 16. The patterned third conductive layer 58 includes a pixel electrode 60 electrically connected to the drain electrode 48*b* and a top UV sensing electrode 62 disposed on a surface of the patterned first silicon-rich dielectric layer 34.

Figure 9:
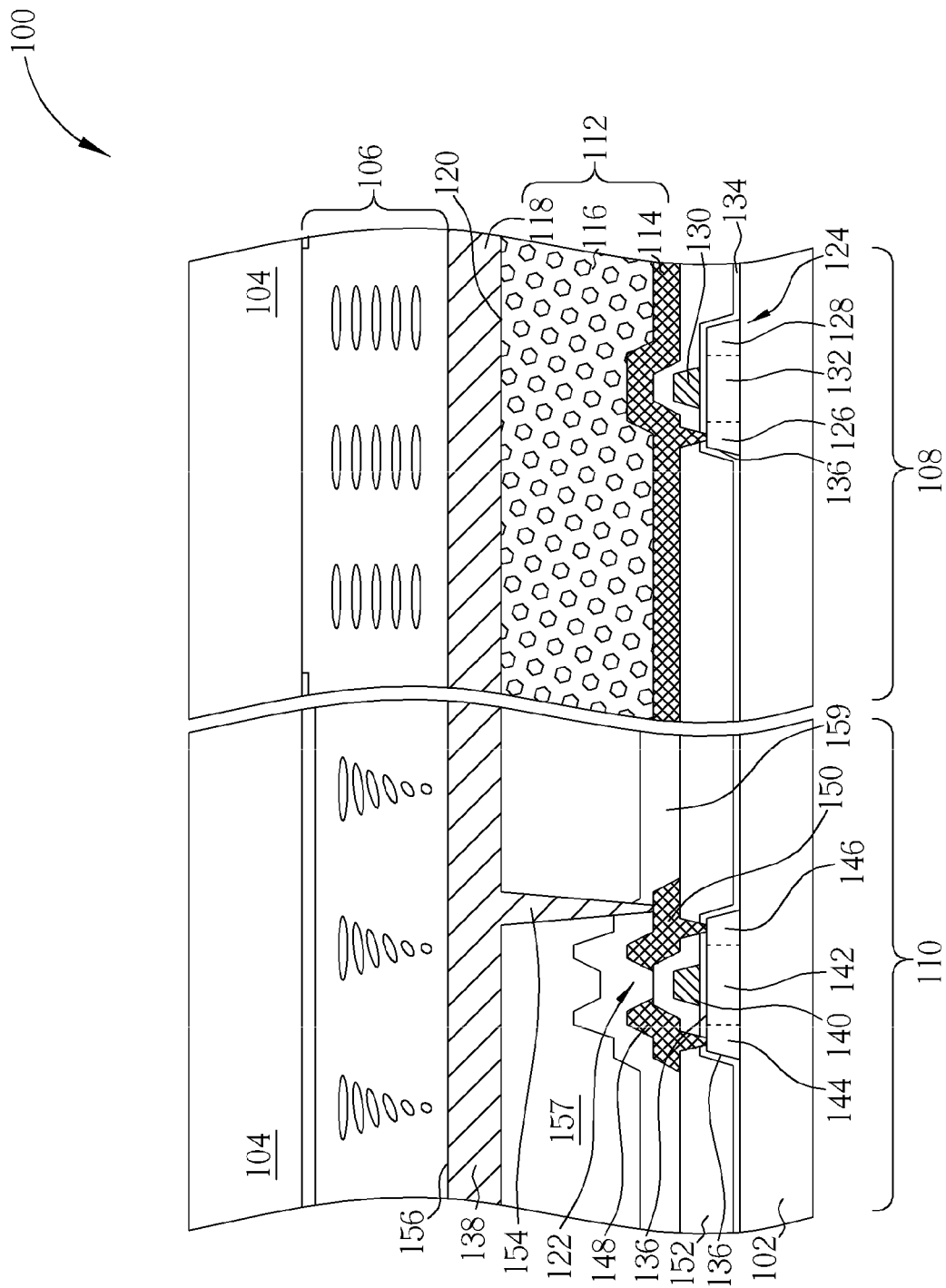
FIG. 9 is a schematic cross-sectional diagram of a third embodiment of a flat display panel of the present invention.

Referring to FIG. 9, FIG. 9 is a schematic cross-sectional diagram of a third embodiment of a flat display panel 100 of the present invention. The flat display panel 100 of the present embodiment is a low temperature polycrystalline silicon (LTPS) display panel. The flat display panel 100 includes a lower substrate 102, an upper substrate 104, and a liquid crystal material layer 106 disposed between the lower substrate 102 and the upper substrate 104. The flat display panel 100 further includes a UV sensor 108 and a plurality of pixel structures 110 disposed in a peripheral region and a display region of the flat display panel 100 respectively. The UV sensor 108 includes at least a UV sensing structure 112 which from bottom to top includes a bottom UV sensing electrode 114, a UV sensing device 116, and a top UV sensing electrode 118. The UV sensing device 116 is composed of a patterned first silicon-rich dielectric layer 120 with a refractive index in a range of about 1.7 to about to about 2.5. Preferred the patterned first silicon-rich dielectric layer 120 made of Si-rich silicon oxide (SiOx), Si-rich silicon nitride (SiNy), Si-rich silicon oxynitride (SiOxNy), Si-rich silicon oxycarbide (SiOxCz), hydrogenated Si-rich silicon nitride (SiNy:H), hydrogenated Si-rich silicon oxide (SiOx:H), hydrogenated silicon-rich silicon oxynitride (SiOxNy:H), hydrogenated silicon-rich silicon oxycarbide (SiOxCz:H) or combinations of above materials, wherein $0<x<2$, $0<y<1.33$, $0<z<$. Similar to the first embodiment of the present invention, during the fabrication of the patterned first silicon-rich dielectric layer 120, a CVD process may be performed to deposit a first silicon-rich dielectric layer on to the surface of the lower substrate 102. Wherein, the CVD process has a SiH4 to N2O gas flow ratio of about 1.2 to about 10, and a H2 to SiH4 gas flow ratio of about 0 to about 8. Next, a laser annealing process is optionally performed to the first silicon-rich dielectric layer so that the first silicon-rich dielectric layer can exhibit a silicon nanocrystal structure therein. In a preferred embodiment, the patterned first silicon-rich dielectric layer 120 has a thickness of about 50 nanometers to about 500 nanometers.

In addition, the UV sensor 108 may optionally include a thin film transistor 124 disposed below the UV sensing structure 112 and electrically connected to the bottom UV sensing electrode 114. The thin film transistor 124 includes a portion of a patterned low temperature polycrystalline silicon layer 136 disposed on the surface of the lower substrate 102, a gate dielectric layer 134 covering the patterned low temperature polycrystalline silicon layer 136, and a gate electrode 130 disposed on the gate dielectric layer 134. The portion of the patterned low temperature polycrystalline silicon layer 136 of the thin film transistor 124 includes a semiconductor channel region 132 and ion doped regions 126 and 128, such as n+ ion doped regions. The ion doped regions 126 and 128 may act as the drain electrode and the source electrode of the thin film transistor 124 respectively and one of the ion doped regions 126 and 128 is electrically connected to the bottom UV sensing electrode 114.

On the other hand, the pixel structure 110 includes a thin film transistor 122 and a pixel electrode 138. The thin film transistor 122 also include a portion of the patterned low temperature polycrystalline silicon layer 136, a gate dielectric layer 134, a gate electrode 140 disposed on the surface of a part of the gate dielectric layer 134 above the portion of the patterned low temperature polycrystalline silicon layer 136, an interlayer dielectric layer 152 covering the gate electrode 140 and the gate dielectric layer 134, and a source electrode 148 and a drain electrode 150 disposed above the gate dielectric layer 134 and the interlayer dielectric layer 152. Similarly, the patterned low temperature polycrystalline silicon layer 136 included in the thin film transistor 122 has a semiconductor channel region 142 and ion doped regions 144 and 146. The interlayer dielectric layer 152 exposes parts of the ion doped regions 144 and 146 such that the exposed parts of the ion doped regions 144 and 146 are electrically connected to the source electrode 148 and the drain electrode 150 respectively. Therefore, the thin film transistor 122 and the thin film transistor 124 are both low temperature polycrystalline silicon thin film transistors. A passivation layer 159 and a planarization layer 157 are optionally disposed above the thin film transistor 122, exposing a part of the drain electrode 150. Therefore the drain electrode 150 is electrically connected to the pixel electrode 138 disposed on the planarization layer 157 through the contact device 154 disposed in the planarization layer 157 and the passivation layer 159. In a preferred embodiment, the ion doped regions 144, 146, 126 and 128 may be formed through the same ion implantation process. The pixel electrode 138, the contact device 154, and the top UV sensing electrode 118 may be formed with the same patterned conductive layer 156 that may include a transparent conductive material. It should be noted that the interlayer dielectric layer 152 is also disposed below the UV sensing structure 112 for isolating the UV sensing structure 112 and the thin film transistor 124. Therefore, the bottom UV sensing electrode 114 partially covers the interlayer dielectric layer 152.

Figure 10:
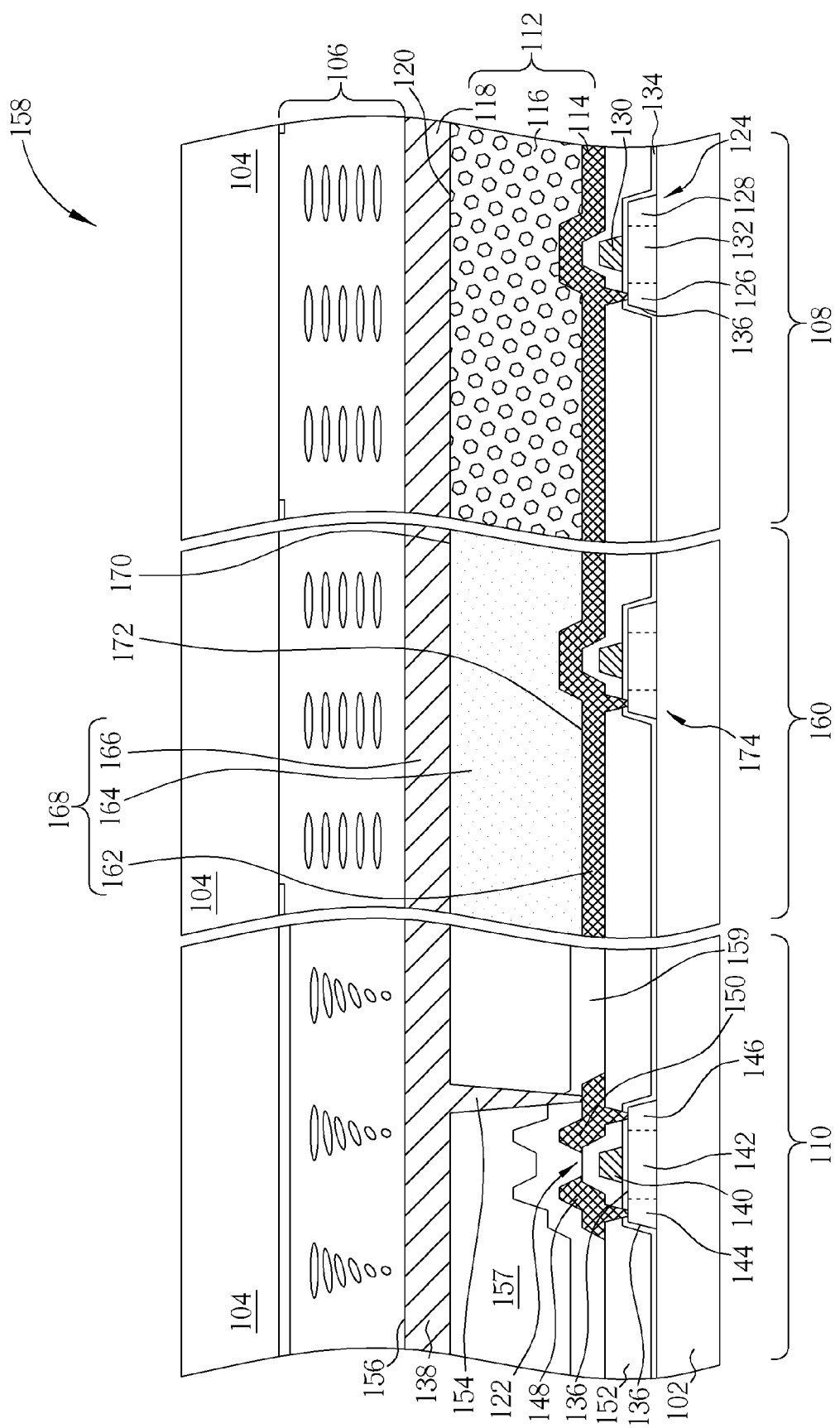
FIG. 10 is a schematic cross-sectional diagram of a fourth embodiment of a flat display panel of the present invention.

Referring to FIG. 10, FIG. 10 is a schematic cross-sectional diagram of a fourth embodiment of a flat display panel 158 of the present invention. Wherein, similar or the same devices are designated with the same numerals shown in FIG. 9. The flat display panel 158 of the present embodiment includes a UV sensor 108, a visible light sensor 160, and a pixel structure 110. Structures of the UV sensor 108 and the pixel structure 110 are similar to the previous embodiment and the same descriptions are not repeated. The visible light sensor 160 includes at least a visible light sensing structure 168, and the visible light sensing structure 168 from bottom to top includes a bottom visible light sensing electrode 162, a visible light sensor device 164, and a top visible light sensing electrode 166. The visible light sensor device 164 is composed of a patterned second silicon-rich dielectric layer 170. The fabrication method, process conditions, and material selections are similar to that of the patterned second silicon-rich dielectric layer 36 of the first embodiment, and the patterned second silicon-rich dielectric layer 170 has a refractive index in a range of about 2.5 to about 3.3. Furthermore, the steps of forming the patterned second silicon-rich dielectric layer 170 may include a laser annealing process so that the patterned second silicon-rich dielectric layer 170 can exhibit a silicon nanocrystal structure therein. The bottom visible light sensing electrode 162, the source electrode 148, the drain electrode 150, and the bottom UV sensing electrode 144 may be formed with the same patterned conductive layer 172. On the other hand, the top visible light sensing electrode 166, the pixel electrode 138, and the top UV sensing electrode 118 may be formed with the same patterned conductive layer 156. It should be noted that, during the fabrication of the flat display panel 158, the order of forming the patterned second silicon-rich dielectric layer 170 and the patterned first silicon-rich dielectric layer 120 is not particularly limited provided that the patterned conductive layer 156 is formed on the surface of the lower substrate 102 after the formation of the patterned second silicon-rich dielectric layer 170 and the patterned first silicon-rich dielectric layer 120 are both completed. In addition, the visible light sensor 160 of the present embodiment further includes at least a thin film transistor 174 disposed below the visible light sensing structure 168, and the thin film transistor 174 is electrically connected to the bottom visible light sensing electrode 162. The fabrication method of the thin film transistor 174 is similar to that of the thin film transistor 124, and both thin film transistors 174 and 124 may be fabricated under the same process steps. Detail descriptions of the fabricated method are not repeated.

In comparison with the prior art, the silicon-rich dielectric material used in the UV sensor of the present invention has a relatively higher bang gap, and the silicon-rich dielectric material has a specific range of refractive index (about 1.7 to about 2.5); therefore, the silicon-rich dielectric material exhibits an excellent photo-responsivity to the wavelengths of UV lights. In addition, the UV sensor of the present invention may also be integrated and applied along with the visible light sensor with a silicon-rich dielectric material as its light sensing material on a thin film transistor substrate. By only modifying the light sensing materials in the UV sensor and the visible light sensor, such as adjusting the range of the refractive index or providing different materials of the silicon-rich dielectric materials of the two sensors, the UV sensor and the visible light sensor would exhibit an excellent sensing effect to both the UV and the visible light. Therefore, the flat display panel including the UV sensor and the visible light sensor of the present invention has advantages of high process integration, low fabrication cost, large-area production, and excellent reliability, which effectively resolves the issues with high fabrication cost of light sensing material, poor reliability, or difficult integration of conventionally UV sensor. Furthermore, added values to the flat display panel and related products are provided according to the present invention.

Those skilled in the art will readily observe that numerous modifications and alterations of the device and method may be made while retaining the teachings of the invention.

What is claimed is:

1. A flat display panel, comprising:
   a lower substrate comprising a display region and a peripheral region;
   an upper substrate disposed in parallel to and above the lower substrate;
   a display material layer disposed between the upper substrate and the lower substrate;
   at least a pixel structure disposed in the display region; and
   at least a UV sensing structure disposed in the peripheral region, the UV sensing structure comprising:
      a bottom UV sensing electrode disposed on a surface of the lower substrate;
      a patterned first silicon-rich dielectric layer for absorbing UV lights disposed on a surface of the bottom UV sensing electrode, the refractive index of the patterned first silicon-rich dielectric layer ranging from about 1.7 to about 2.5; and
      a top UV sensing electrode disposed on a surface of the patterned first silicon-rich dielectric layer.

2. The flat display panel of claim 1, wherein the patterned first silicon-rich dielectric layer comprises materials of silicon-rich silicon oxide (SiOx), silicon-rich silicon nitride (SiNy), silicon-rich silicon oxynitride (SiOxNy), silicon-rich silicon oxycarbide (SiOxCz), hydrogenated silicon-rich silicon nitride (SiNy:H), hydrogenated silicon-rich silicon oxide (SiOx:H), hydrogenated silicon-rich silicon oxynitride (SiOxNy:H), hydrogenated silicon-rich silicon oxycarbide (SiOxCz:H) or combinations of above.

3. The flat display panel of claim 1, wherein the patterned first silicon-rich dielectric layer has a thickness of about 50 nanometers to about 500 nanometers.

4. The flat display panel of claim 1, further comprising at least a visible light sensor structure disposed in the peripheral region.

5. The flat display panel of claim 4, wherein the visible light sensing structure comprises:
   a bottom visible light sensing electrode;
   a patterned second silicon-rich dielectric layer for absorbing a visible light disposed on a surface of the bottom visible light sensing electrode, the patterned second silicon-rich dielectric layer having a refractive index in a range of about 2.5 to 3.3; and
   a bottom visible light sensing electrode disposed on a surface of the patterned second silicon-rich dielectric layer.

6. The flat display panel of claim 1, wherein an area of the bottom UV sensing electrode is larger than an area of the patterned first silicon-rich dielectric layer.

7. The flat display panel of claim 1, wherein the pixel structure comprises a pixel electrode, and the pixel electrode and the top UV sensing electrode are composed of same transparent conductive materials.

8. The flat display panel of claim 7, wherein the pixel structure further comprises a thin film transistor comprising:
   a gate electrode disposed on the surface of the lower substrate;
   a gate dielectric layer covering the gate electrode;

a patterned semiconductor layer disposed on a part of a surface of the gate dielectric layer above the gate electrode;

a source electrode and a drain electrode disposed on a surface of the patterned semiconductor layer, the drain electrode being electrically connected to the pixel electrode; and a passivation layer covering the source electrode and a part of the drain electrode;

wherein the gate dielectric layer covers a part of the patterned first silicon-rich dielectric layer and a part of the bottom UV sensing electrode, and the top UV sensing electrode covers a part of the gate dielectric layer and a part of the passivation layer.

9. The flat display panel of claim 7, wherein the pixel structure further comprises a thin film transistor comprising:

a patterned low temperature polycrystalline silicon layer disposed on the surface of the lower substrate;

a gate dielectric layer covering a surface of the patterned low temperature polycrystalline silicon layer;

a gate electrode disposed on a surface of a part of the gate dielectric layer above the patterned low temperature polycrystalline silicon layer;

an interlayer dielectric layer covering the gate electrode and the gate dielectric layer and exposing a part of the patterned low temperature polycrystalline silicon layer;

a source electrode electrically connected to the patterned low temperature polycrystalline silicon layer; and a drain electrode electrically connected to the patterned low temperature polycrystalline silicon layer and the pixel electrode;

wherein the bottom UV sensing electrode covers a part of the interlayer dielectric layer.

10. The flat display panel of claim 9, wherein the patterned first silicon-rich dielectric layer further comprises a silicon nanocrystal structure therein.

11. The flat display panel of claim 1, wherein the UV sensing structure further comprises a thin film transistor electrically connected to the bottom UV sensing electrode.

12. The flat display panel of claim 1, comprising a liquid crystal display panel, an electrophoretic display panel or an organic electroluminescent light emitting diode display panel.

13. A UV sensor, comprising:

a substrate; and at least a UV sensing structure disposed on the substrate, the UV sensing structure comprising:

a bottom UV sensing electrode disposed on a surface the substrate;

a patterned first silicon-rich dielectric layer for absorbing UV lights disposed on a surface of the bottom UV sensing electrode, the patterned first silicon-rich dielectric layer having a refractive index in a range of about 1.7 to about 2.5; and a top UV sensing electrode disposed on a surface of the patterned first silicon-rich dielectric layer.

14. The UV sensor of claim 13, wherein the patterned first silicon-rich dielectric layer comprises materials of silicon-rich silicon oxide (SiOx), silicon-rich silicon nitride (SiNy), silicon-rich silicon oxynitride (SiOxNy), silicon-rich silicon oxycarbide (SiOxCz), hydrogenated silicon-rich silicon nitride (SiNy:H), hydrogenated silicon-rich silicon oxide (SiOx:H), hydrogenated silicon-rich silicon oxynitride (SiOxNy:H), hydrogenated silicon-rich silicon oxycarbide (SiOxCz:H) or combinations of above.

15. The UV sensor of claim 13, wherein the patterned first silicon-rich dielectric layer has a thickness of about 50 nanometers to about 500 nanometers.

16. The UV sensor of claim 13, wherein the UV sensing structure further comprises a thin film transistor electrically connected to the bottom UV sensing electrode.

* * * * *